US007419766B2

(12) United States Patent
Kimelblat et al.

(10) Patent No.: US 7,419,766 B2
(45) Date of Patent: Sep. 2, 2008

(54) FLEXOGRAPHIC PRINTING PLATE PRECURSOR AND IMAGING METHOD

(75) Inventors: Jankiel Kimelblat, Ra'anana (IL); Murray Figov, Ra'anana (IL); Yariv Y. Pinto, Petach Tikva (IL)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/353,217

(22) Filed: Feb. 13, 2006

(65) Prior Publication Data

US 2007/0190452 A1 Aug. 16, 2007

(51) Int. Cl.
*G03F 7/00* (2006.01)
*G03F 7/004* (2006.01)

(52) U.S. Cl. .................... 430/302; 430/271.1; 430/306; 430/434; 430/494; 430/944; 430/945; 101/453; 101/463.1

(58) Field of Classification Search .............. 430/271.1, 430/306, 434, 494, 944, 945; 101/453, 463.1
See application file for complete search history.

(56) References Cited

U.S. PATENT DOCUMENTS

| | | | | |
|---|---|---|---|---|
| 3,549,733 A | 12/1970 | Caddell | | |
| 3,929,898 A * | 12/1975 | Nienburg et al. | ............ | 568/453 |
| 4,323,636 A | 4/1982 | Chen | | |
| 4,994,344 A | 2/1991 | Kurtz et al. | | |
| 5,719,009 A | 2/1998 | Fan | | |
| 5,798,202 A | 8/1998 | Cushner et al. | | |
| 5,804,353 A | 9/1998 | Cushner et al. | | |
| 5,858,617 A * | 1/1999 | Nakayama et al. | ....... | 430/281.1 |
| 6,159,659 A | 12/2000 | Gelbart | | |
| 6,238,837 B1 * | 5/2001 | Fan | ......................... | 430/273.1 |
| 6,521,390 B1 * | 2/2003 | Leinenbach et al. | ...... | 430/273.1 |
| 6,599,679 B2 * | 7/2003 | Philipp et al. | ............ | 430/273.1 |
| 6,627,385 B2 | 9/2003 | Hiller et al. | | |
| 6,756,181 B2 * | 6/2004 | Yang et al. | ............... | 430/273.1 |
| 6,773,859 B2 * | 8/2004 | Fan et al. | .................... | 430/200 |
| 7,226,709 B1 * | 6/2007 | Kidnie et al. | .................. | 430/5 |
| 2002/0009672 A1 * | 1/2002 | Daems et al. | ............ | 430/273.1 |
| 2005/0115920 A1 | 6/2005 | Hiller et al. | | |

FOREIGN PATENT DOCUMENTS

| | | |
|---|---|---|
| EP | 1 529 637 | 5/2005 |
| WO | 2005/084959 | 9/2005 |

* cited by examiner

*Primary Examiner*—Amanda C. Walke
(74) *Attorney, Agent, or Firm*—J. Lanny Tucker

(57) ABSTRACT

A laser imageable flexographic printing plate precursor comprises a thermoset elastomeric upper layer that is at least partially ablatable and comprises a radiation sensitive compound, and a non-ablatable elastomeric underlayer. This flexographic printing plate precursor can be imaged to provide a printing plate that is primarily useful for "high quality" printing because the resulting relief image is generally not greater than 600 μm and has an extremely even "floor". The imaged flexographic printing plate also can have a high visual contrast between the imaged areas and the non-imaged background areas.

23 Claims, 1 Drawing Sheet

FLEXOGRAPHIC PRINTING PLATE PRECURSOR AND IMAGING METHOD

FIELD OF INVENTION

This invention relates to laser-imageable flexographic printing plate precursors and to an imaging process used for producing printing plates that have high visual contrast and can be used to provide high resolution printing.

BACKGROUND OF THE INVENTION

Flexography is a method of printing whereby a flexible plate with a relief image is wrapped around a cylinder and its relief image is inked up and the ink is then transferred to a suitable printable medium. The process has mainly been used in the packaging industry where the plates should be sufficiently flexible and the contact sufficiently gentle to print on uneven substrates such as corrugated cardboard as well as flexible materials such as polypropylene film. The quality of the printing in this manner is inferior to processes such as lithography and gravure, but nevertheless it is useful in certain markets. In order to accommodate the various types of printing media, the flexographic plates should have a rubbery or elastomeric nature whose precise properties can be adjusted for each particular printable medium.

In addition, where the flexographic printing plates are formed and/or imaged in a flat form, they should be flexible for bending around a cylinder for rotary printing. This can present more of a problem than with offset lithographic plates because the thickness of flexographic printing plates is generally several millimeters instead of fractions of a millimeter. Materials that are flexible as one or two μm films can be rigid and inflexible at one or more mm.

U.S. Pat. No. 4,323,636 (Chen) describes elements having thermoplastic elastomeric block copolymers (for example, those sold by Kraton Polymers under the trademark of KRATON) used in conjunction with an acrylate or methacrylate monomer and a photoinitiator. The upper surface may have on it a thin hard flexible solvent insoluble coating and on top of this a strippable thin film of e.g. polyethylene to protect the plate during storage. This would constitute a flexographic printing plate precursor that can be imaged by ultra-violet exposure through a negative mask, and the un-polymerized material washed away with solvent. Such elements usually have a thickness of one or more millimeters. Exposure from the front through an image bearing transparency is sufficient to polymerize both the image areas and the underlying layer. The block co-polymer materials formulated as printing blanks, whilst being able to be formed into solid blanks, retain a stickiness on their upper and lower surfaces that requires the use of protective films to prevent unused plates sticking together during storage.

U.S. Pat. No. 4,994,344 (Kurtz et al.) describes flexographic printing blanks prepared from ethylene-propylene-alkadiene terpolymers. It describes the process of initial back exposure to establish the “floor” of the plate before image exposure from the front of the plate through a negative mask. The image floor may be uneven due to differences in evenness of UV exposure and subsequent wash-out, but this would be of little consequence where image thickness (relief) is measured in millimeters. Because the plate requires back exposure, a polyester substrate is often used as the dimensionally stable backing material and must be transparent to UV light. In addition, the floor material of the plate is of the same material and formulation as the image areas. Thus, the finished plate generally has little or no visual contrast between the image areas and the floor and it is difficult for the user to make any visual assessment of the image because of this lack of contrast.

U.S. Pat. No. 5,719,009 (Fan) describes the use of a negative mask that is integral in the flexographic printing plate itself. The flexographic printing plate comprises photosensitive layers and an overcoat containing carbon black with a binder resin. The overcoat is ablated with an infrared laser in response to a digital signal generated by a computer. Digital imaging using a modulated laser source is an important part of the general technology that has become known as computer-to-plate (CTP) and is used for instance in the production of offset lithographic printing plates. The ablated areas in the overcoat permit a subsequent irradiation by UV light to expose the sensitive elastomeric layer and to harden it. The other unexposed areas situated under the non-ablated areas of the overcoat are washed away together with the remains of the carbon layer, leaving a relief image. In this case, there is good visual contrast between the masked areas that remain after ablation and the image areas that are exposed by ablation. However, after UV exposure and subsequent wash-out processing, any visual contrast disappears as the overcoat is washed away with the underlying unexposed background areas, so that the imaged flexographic printing plate has no visual contrast between the image and the background. The UV exposure and washing process still results in unevenness of the image floor.

It has long been recognized that the simplest way of making a flexographic printing plate would be by direct engraving using laser beam ablation, thereby eliminating all need for washing or drying the plate or multiple types of exposure.

U.S. Pat. No. 3,549,733 (Caddell) describes the formation of a laser engraved (or imaged) relief printing plate. However, the described plates do not have the elastomeric properties needed for flexographic printing but could be used in letterpress printing. Letterpress printing differs significantly from flexographic printing in that it is more like lithography in the complexity of the printing machine and the type of ink used. Letterpress inks must have high viscosity (paste-like), similar to offset inks and do not in general contain volatile solvents. If the letterpress printing is carried out using an offset blanket, the printing process is termed dry offset. As with offset printing, dry offset and letterpress require high pressure between the plate and blanket or printable media to achieve good ink transfer, whereas flexographic printing uses the minimum pressure possible. Thus a letterpress plate would be unsuitable for flexographic printing as it would not give good ink transfer under low pressure and similarly a flexographic plate would be unsuitable for letterpress as the high pressure would distort the softer plate and give very poor image quality with huge dot gain.

U.S. Pat. Nos. 5,798,202 and 5,804,353 (both Cushner et al.) describe the use of single or multiple layers of elastomers in flexographic printing plate precursors for direct laser engraving. The upper layer of the precursors is comprised of a thermoplastic elastomeric material.

Imaging sensitivity is limited by the use of large quantities of block polymers, such as those sold under the trade name of KRATON by Kraton Polymers. Poor melt edges are reported for flexographic engraving of layers containing such polymers in U.S. Pat. No. 6,627,385 (Hiller, in the Comparative Examples). The patent also describes the problem of using carbon black or opaque fillers in that the flexographic printing plate loses its transparency, which complicates mounting it with accurate register, since register crosses or similar marks, are no longer visible through the plate. Hiller suggests avoiding such layers.

U.S. Pat. No. 6,159,659 (Gelbart) describes a flexographic printing plate precursor having two ablatable layers, the upper layer comprising an elastomeric foam mounted on a thin non-ablatable backing layer where preferably ablation removes material right down to the backing layer. The method is intended to solve the problem in the prior art of small holes and nicks in the backing caused by exposure by the laser that reduce the life of the printing plate. However, no attempt is made to provide very high adhesion between the two layers that may be needed especially for small isolated image areas.

Problem to be Solved

Despite the limitations of carbon dioxide lasers, they are now being used commercially in flexographic engraving machines. They are known for slow and expensive imaging with limited resolution. However, the advantages of direct engraving are sufficient to ensure their commercial use in instances where fast imaging and high print quality are not required. It would be preferable to use infrared diodes that produce radiation in the near infrared and infrared (approximately 700 to 1200 nm) and have the advantages of high resolution and relatively low laser cost so that they can be used in large arrays. Until now, although the use of such lasers is described in many publications, they are not in industrial use because even when combined with the most sensitive imageable elements available, satisfactory engraving may not be achieved.

Infrared diode engraving (or ablative imaging) differs from that of carbon dioxide in that a compound absorbing suitable radiation (that is, IR radiation) is usually incorporated into the imaged coating. The use of an organic infrared radiation-sensitive dye (IR dye) may be prohibitive because it is costly and a large quantity of IR dye is needed throughout the imaging layer (which may be millimeters thick). The use of an opaque pigment such as carbon black reduces the possibility of visual contrast even further. Another problem experienced with high carbon and other fillers is the loss in layer resilience. Good resilience ensures the rapid elimination of any distortion of the plate during a printing cycle by permitting the plate to recover its original shape in time for the next cycle. Distortion may also occur from dirt entering the printing system and causing temporary indentations in the printing plate surface. Thus, good resilience is needed to provide fast recovery from distortion of any type.

The recent availability of high power (for example, 8 watts) IR-laser diodes opens up opportunity for the use of relatively low cost laser diode arrays capable of engraving flexographic blanks as described in WO 2005/84959 (Figov). Relief depth in the resulting image is an issue with laser engraving because the deeper the required relief, either more power is required or it takes longer to engrave or image the plate. Besides the segment of the flexographic market that involves deep relief, laser engraving is most suitable and competitive when applied to the high quality market segment using even substrates where low relief is a distinct advantage. In this market segment, it is of no advantage to work with high relief images as the image areas would have the possibility of more movement during printing and more dot gain and inaccuracy of printing. However, in order to achieve minimum image relief, the floor of the image should be extremely even, otherwise there is the danger that any slightly elevated floor area would give unwanted background printing.

SUMMARY OF THE INVENTION

The present invention overcomes noted problems with a laser imageable flexographic printing plate precursor comprising:

a thermoset, elastomeric upper layer that is at least partially ablatable and comprises a radiation sensitive compound, and a non-ablatable elastomeric underlayer.

This invention also provides a method of producing a flexographic printing plate comprising:

imagewise exposing the laser imageable flexographic printing plate precursor described above, to provide at least partially ablated imaged areas in the upper layer.

The present invention also relates to the imaged flexographic printing plates obtained by the method of this invention.

This invention addresses the problems of uneven image floor and the lack of image to background contrast found with prior art flexographic methods and printing plates. Thus, the present invention provides a laser-engraveable (that is, laser ablation-imageable) flexographic printing plate precursor that can be primarily used for "high quality" printing because the resulting printing plate relief image is generally not greater than 600 μm. The imaging method of this invention provides a flexographic printing plate with an extremely even "floor" in the relief image.

The present invention also provides an imaged flexographic printing plate having a high visual contrast between the image areas and the non-image background areas. For example, this high visual contrast between the image areas and the non-image background areas can be achieved particularly when the ablated background areas are white and the non-ablated image areas are black.

DETAILED DESCRIPTION OF THE INVENTION

Definitions

Figure 1:
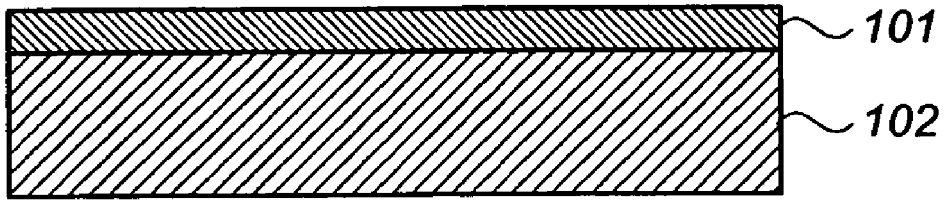
FIG. 1 shows a cross-sectional view of a flexographic printing plate precursor of this invention with minimal layers.

The term "blank" is used in this application to describe a non-imaged printing plate (or printing plate precursor).

Unless otherwise indicated, the term "flexographic printing plate precursor" refers to embodiments of the present invention prior to imaging. The term "flexographic printing plate" refers to the imaged flexographic printing plate precursors that can then be used for printing.

By "floor" of the printing plate, we mean the bottom surface of the relief depth in an image area.

In addition, unless the context indicates otherwise, the various components described herein such as "radiation absorbing compound", "carbon black", "elastomeric material", and similar terms also refer to mixtures of such components. Thus, the use of the article "a" is not necessarily meant to refer to only a single component.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure AppL. Chem.* 68, 2287-2311(1996). However, any definitions explicitly set forth herein should be regarded as controlling.

As is known in the art, a "thermoplastic polymer" is one that is capable of being repeatedly softened (by heating) and hardened (by cooling) through a characteristic temperature range, and that in its softened state, can be made to flow and to be shaped into articles by molding or extrusion. The change in thermoplastic materials upon heating and cooling is substantially physical in nature.

A "thermosetting" polymer is one that is capable of being changed into a substantially infusible or irreversibly hardened material upon curing by heat or other means. Such a cured polymer is considered as being "thermoset".

Flexographic Printing Plate Precursor

The present invention provides solid flexographic printing plate precursors or blanks (including sleeve blanks) that are characterized by the presence of two or more layers. The thermoset, elastomeric uppermost layer (identified as the "upper layer" herein) generally has a relatively thin dry thickness of from about 50 to about 600 μm and preferably from about 200 to about 400 μm. The upper layer is ablated during imaging generally by directing the imaging laser to the upper layer through the top of this layer. The upper layer is at least partially (greater than 10% of original dry weight) removed in the imaged area, and preferably it is substantially removed (greater than 50%) or fully removed (at least 90%) in the imaged areas where ablation occurs. Alternatively, where the underlayer and support, if present, (both described below) are substantially transparent, laser imaging can be directed through the underlayer and into the upper layer.

Below the upper layer are one or more layers that are generally not sensitive to imaging radiation and therefore not engraveable (non-imageable or non-ablatable) during imaging to a substantial extent (less than 5%). The layer immediately below the upper layer provides the image "floor" or maximum depth of the relief image and it can thus serve as a substrate material for the flexographic printing plates. This elastomeric "underlayer" generally has a dry thickness of less than 1.7 mm. Preferably, it has a dry thickness of from about 0.5 to about 1.5 mm.

In some instances, the underlayer can also have reflective properties on its upper surface or uniformly throughout from the coating or incorporation of reflective materials such as pigments or dyes, or other means of providing opacity or reflectivity. Such reflectivity can enhance imaging sensitivity by reflecting imaging radiation back into the upper layer to increase ablation as well as providing visual contrast with the non-ablated image areas.

In some embodiments, there is an intermediate polymeric film between the upper layer and the underlayer that can form the "floor" of the relief image. This intermediate layer is generally non-ablatable and can be a precast sheet of polymer film such as a sheet of poly (ethylene terephthalate). This polymer film can also have reflective properties on its surface or uniformly throughout from the incorporation of reflective materials such as pigments or dyes, or other means of providing opacity or reflectivity. Such reflectivity can enhance imaging sensitivity by reflecting imaging radiation back into the upper layer as well as providing contrast with the non-ablated image areas.

In its simplest construction, the flexographic printing plate precursor of this invention includes an upper layer and an underlayer that are arranged adjacent to one another. FIG. 1 illustrates such embodiments. Thermoset, elastomeric upper layer 101 is at least partially ablatable during imaging, and preferably, it is substantially entirely ablatable, that is, there is substantially no upper layer material left in imaged areas. The upper layer also includes a suitable radiation sensitive compound (described in more detail below).

Upper layer 101 is designed to be sensitive to and at least partially ablatable by appropriate imaging radiation, for example IR radiation. Ablation by an IR-laser is the preferred means for imaging. Generally, the upper layer comprises one or more ablatable thermoset, elastomeric polymers and one or more radiation sensitive compounds, such as IR radiation absorbing compounds.

Preferably, the upper layer is composed of the materials described for ablatable layers described, for example in WO 2005/84959 (noted above) that is incorporated herein by reference. For example, the upper layer can comprise one or more mono- and polyacrylate oligomers or monomers, including urethane acrylates, carbon black fillers (or other IR radiation sensitive compounds), and plasticizers. Particularly useful acrylates include urethane diacrylate oligomers, isobornyl acrylate and methacrylate monomers that can be obtained, for example, from Cray Valley. These materials can be "cured", polymerized, or crosslinked using any of a variety of crosslinking agents, but peroxides are preferred.

The radiation absorbing compounds (such as infrared radiation absorbing compounds) present in the upper layer generally absorb radiation at from about 600 to about 1200 and preferably at from about 700 to about 1200 nm, with minimal absorption at from about 300 to about 600 nm. These compounds (sometimes known as a "photothermal conversion materials") absorb radiation and convert it to heat. Such materials may be pigments or dyes, but when formulated into the cross-linkable layer must be resistant to attack of free radicals formed by either heat or UV radiation used in the crosslinking process of plate production, so that they maintain their IR absorption for use in the solid printing plate precursors. Examples of suitable materials are carbon blacks, iron oxides, and nigrosine dye.

Upper layer 101 can also include various addenda such as plasticizers, for example, oleyl alcohol and low molecular weight liquid polyisoprene.

The flexographic printing plate precursor can also have elastic properties that are provided by the layers underneath the upper layer, for example, by elastomeric underlayer 102. Useful elastomeric materials for the underlayer include but are not limited to, EPDS rubbers and block copolymers such as polystyrene-polyisoprene-polystyrene copolymers that are sold by Kraton Polymers under the tradename of KRATON. Other suitable elastomeric materials include silicone rubbers and mixtures of acrylic pre-polymers that are commonly used in liquid photopolymer flexographic printing plates (described for example in U.S. Pat. No. 6,403,269 (Leach) that is incorporated herein by reference).

Preferred compositions of the elastomeric underlayer include the same or different mono- and polyacrylate oligomers or monomers, including urethane acrylates, described for upper layer 101 above. Particularly useful acrylates include urethane diacrylate oligomers, isobomyl acrylate and methacrylate monomers that can be obtained, for example, from Cray Valley. These underlayer materials can be "cured", polymerized, or crosslinked using any of a variety of crosslinking agents, but peroxides are preferred. Thus, the crosslinked underlayer can also be composed of thermoset materials. The polymeric composition of upper layer 101 and underlayer 102 can be the same or different. Thus, the same or different acrylates can be crosslinked with the same or different crosslinking agent in both layers.

The underlayer can be transparent or it may contain pigments to provide opacity. For example, it may contain a white pigment (such as barium sulfate, titanium dioxide, magnesium oxide, and zinc oxide) to provide visual contrast with the non-imaged areas of the upper layer. In addition, opacity in the underlayer can also provide reflectivity and thus reflect imaging radiation back into the upper layer to improve imaging sensitivity. If underlayer 102 is transparent, then instead of directing the imaging laser from the top side of upper layer 101, it may be directed through underlayer 102 where the entire upper layer 101 is to be removed in the background areas. The elastomeric material in the underlayer can be treated or crosslinked on its surface to reduce any possibility of damage by inks or cleaning solutions during the printing process itself. Alternatively, the elastomeric material can be uniformly crosslinked throughout the underlayer. Some elastomeric materials, such as the block copolymers sold under the trade name of KRATON may have sticky surfaces when used in other types of flexographic plates and these can be protected by a dry polymeric film such as a poly(ethylene terephthalate) film that is usually precast and then applied to the underlayer. However, it has been found that for the present invention, a protective polymeric film is generally unnecessary especially when the elastomeric material is used in crosslinked form.

The upper surface of underlayer 102 may be treated to provide good adhesion to upper layer 101. Such surface treatments can include a chloroprene rubber-based adhesive solution and styrene-butadiene rubber adhesives.

Underlayer 102 can also include various addenda including plasticizers such as oleyl alcohol or low molecular weight liquid polyisoprene.

It has been found that when underlayer 102 has a high resilience, the entire printing plate precursor has a similarly high resilience even when upper layer 101 may have a lower resilience. This resilience enables the printing surface to recover from indentation due to irregular printed surfaces.

An adhesive layer (not shown in FIG. 1) can also be present between upper layer 101 and underlayer 102. This adhesive layer can be relatively thin, that is, less than 2 μm in dry thickness and can be comprised of styrene-butadiene rubber adhesives.

The preferred method of adhering underlayer 102 to upper layer 101 is to use to chemically similar compositions for these layers without any additional adhesive layer or material. Both underlayer 102 and upper layer 101 may be simultaneously crosslinkable by heating because each layer can comprise the same or different acrylic reactants (monomers, oligomers, or polymers) and a peroxide or peroxide-generating compound that will provide free radicals for crosslinking the acrylic reactants.

Upper layer 101 may for instance contain the noted acrylic reactants, inert fillers, carbon black, and the noted peroxide. However, underlayer 102 may contain the same or similar components without the carbon black. If the two layers are formed one on top of the other without curing, then when they are heated together, they form covalent bonds at the interface between the layers. The resulting two-layer composite is therefore similar in composition except for the carbon black in upper layer 101. After imaging, the black imaged upper layer 101 and the white floor of underlayer 102 remain inseparable.

Since the compositions used to form both layers are often paste-like, in order to achieve a flat interface between them, one or other of the layer compositions may be cooled to produce a solid layer. As illustrated in the Examples below, the layers may be prepared in separate molds and then clamped and heated together. If underlayer 102 is a frozen layer, then it is also possible to coat the composition for upper layer 101 onto underlayer 102 followed by heating the two layers simultaneously to cause crosslinking therein. It is also possible to freeze both layer compositions separately and to then press them into intimate contact followed by heating to cause crosslinking within both layers.

Figure 2:
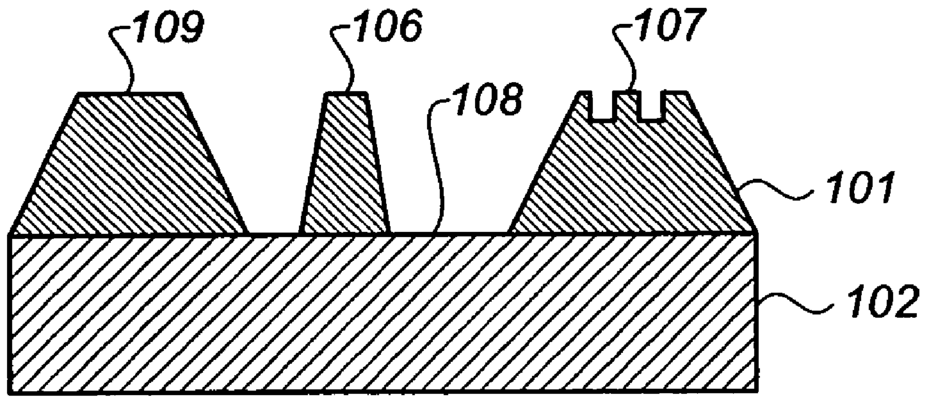
FIG. 2 is a cross-sectional view of an imaged flexographic printing plate after laser imaging (ablation) of the printing plate precursor of FIG. 1.

FIG. 2 shows a cross-sectional view of the flexographic printing plate precursor of FIG. 1 after ablative imaging. Image floor area 108 shows the complete ablation of upper layer 101 down to the upper surface of non-ablatable underlayer 102. Any residue of upper layer 101 left on the floor area 108 may be cleaned off under dry conditions with, for instance, a brush, or washed with water or another aqueous solution. While it is preferred to completely ablate the imaged areas of upper layer 101, down to the upper surface of underlayer 102, partial ablation of the imaged areas is an option where visual contrast is not considered essential. In such instances, upper layer 101 can be from about 0.5 to about 1.5 mm in thickness and underlayer 102 can comprise a compressible cushioning material or mounting tape that is preferably further mounted on a dimensionally stable substrate, for instance a polyester film or metal sheet. Examples of commercially available mounting tapes include those marketed by Lohman Technologies UK Ltd. under the trade name of DuploFLEX or Tesa tapes supplied by Plastotype. Compressible cushions are those materials used commercially under a carrier sheet to absorb excess printing pressure, thus improving printing quality.

Non-imaged (non-ablated) areas 106, 107, and 109 will show as solid areas on the printed media. The edge non-imaged area 107 can be sculpted as shown to minimize print dots movement with consequential dot gain and to bolster adhesion to the floor area 108. Non-imaged area 107 shows fine detail represented by individual image spots. As with other forms of flexographic printing plate precursors, these must be constructed on the imaged plate in such a way that they have small stem heights. The dot height may be less than 50 μm and the dots must have a supporting shoulder. An individual dot is shown as non-imaged area 106 and this too must have a sculptured support.

The resulting flexographic printing plate, ready for flexographic printing, will have a very flat or smooth image floor (since it is insensitive to laser ablation), and with a relief that can be of minimum height as the floor will not have any protrusions or roughness likely to interfere with the printing process and cause background problems by printing on unwanted residues. There can be a visual contrast between the (preferably) black areas of the printing areas (non-imaged areas) in the upper layer, and the transparent or white opaque or light colored floor in the underlayer (imaged areas). If the image floor surface is white, then laser ablation sensitivity may be increased by reflection back of imaging radiation from this surface into the upper layer to aid ablation.

Figure 3:
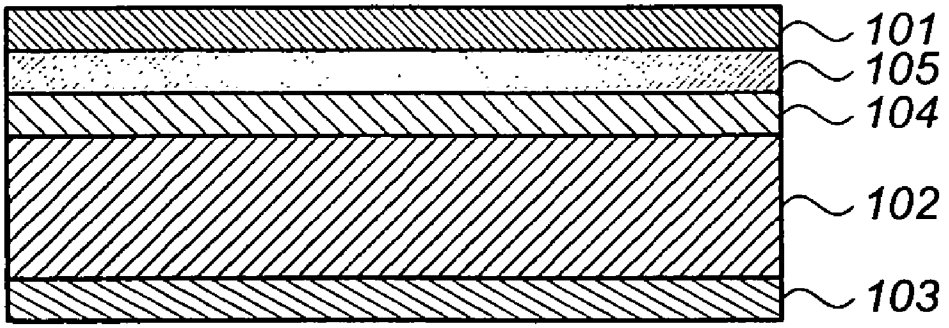
FIG. 3 is a cross-sectional view of a preferred flexographic printing plate precursor of the present invention.

FIG. 3 shows a preferred flexographic printing plate precursor. The embodiment illustrated in FIG. 3 comprises multiple layers, of which preferably only upper layer 101 is ablatable (or imageable) although it is also possible that thin adhesive layer 105 may also be ablatable. Adhesive layer 105 may comprise vacuum evaporated aluminum or a thin polymer coating that may same composition and thickness as described for FIG. 1. It is also possible to omit adhesive layer 105 and bond upper layer 101 directly to non-ablatable interlayer 104. Interlayer 104 may be a pre-cast polymeric film that could be composed of, for instance, polyethylene terephthalate (PET), polyvinyl chloride, or a polycarbonate, or cellulose acetate. This precast film may also be coated on both sides to promote adhesion to both adhesive layer 105 (or upper layer 101 directly) and underlayer 102. Such a coating may serve both as an adhesion promoter and either a radiation reflector or absorber. Interlayer 104 may be of any suitable thickness but preferably below 200 μm to enhance resilience of the entire construction. Interlayer 104 may also be a reflective material containing barium sulfate or other opaque pigments on its upper surface or distributed uniformly throughout. Support 103 is optional but preferred to provide a dimensionally stable backing. Support 103 can be any polymeric film or metallic sheet commonly used in lithographic imaging elements including polymeric films such as polyester films and metallic sheets, such as anodized aluminum, iron, or stainless steel sheets.

Imaging Method

The flexographic printing plate precursor can be therefore used to provide a corresponding flexographic printing plate by imaging with suitable imaging radiation (preferably IR and near IR of from about 600 to about 1200 nm). Various imaging energies are possible depending upon the imaging laser and apparatus, but generally, imaging is carried out using an IR laser and an imaging energy of at least 300 watts and up to 300 J/cm$^2$. Obviously, the imaging energy required for desired ablation will depend upon the particular imaging apparatus, the composition and thickness of the ablated layer(s), and whether partial or complete ablation is desired.

As noted above, laser imaging can be directed from the top of the upper layer, or if the underlayer is transparent, it can be directed from underneath and through the underlayer and into the upper layer.

In preferred embodiments, the upper layer is relatively thin and is completely removed in imaged areas during the imaging method to provide clean, smooth relief areas on the image floor. Any remaining debris may be cleaned off without removal of the non-ablatable layer(s).

The resulting printing plates can then be inked and used in various printing operations under known conditions to print various printable media.

The following examples are provided to illustrate the practice of the invention but are by no means intended to limit the invention in any manner.

Materials and Methods:

For the examples below, the following materials were obtained as follows:

Mogul L is a carbon black that was obtained from Cabot.

Ebecryl 230 and Ebecryl 1259 are urethane acrylic oligomers that were obtained from Cytec Industries.

Cab-O-Sil M5 is an amorphous silica that was obtained from Cabot.

KRATON D1107P is an elastomeric polymer that was obtained from Kraton Polymers.

IRR 577 is an aliphatic monoacrylate that was obtained from Cytec Industries.

Luperox 231 XL40 is 1,1-bis(t-butylperoxy)-3,3,5-trimethylcyclohexane that is blended with silica and calcium carbonate, and was obtained from Aldrich Chemical Company.

All other components were obtained from conventional commercial sources.

EXAMPLE 1

Flexograihic Printing Plate Precursor

An embodiment of this invention like that illustrated in FIG. 1 was prepared and imaged in the following manner:

The following formulation was prepared by adding and mixing the following ingredients in the order shown:

| | |
|---|---|
| Ebecryl 230 (urethane diacrylate) | 28.02 grams |
| Ebecryl 1259 (urethane triacrylate) | 7.36 grams |
| Isobornyl acrylate | 18.49 grams |
| Oleyl alcohol | 6.90 grams |
| IRR 577 (aliphatic monoacrylate) | 7.34 grams |
| Polyester-block polyether diol | 6.51 grams |
| Cumene hydroperoxide | 2.96 grams |
| Magnesium oxide | 14.51 grams |
| Cab-O-Sil M5 | 7.90 grams |

The resulting white paste was used to form an underlayer (like the underlayer 102 of FIG. 1). The paste was placed into an aluminum mold with a release film above and below it. The bottom release film also contained a filler layer that could be removed when the upper layer 101 formulation (see below) was applied. The mold was sealed with an aluminum lid and it was heated in an oven for 20 minutes at 160° C. It was then removed from the oven and cooled with water. The resulting white soft rubbery solid was then removed from the mold.

The following formulation was prepared by adding and mixing the ingredients in the order shown:

| | |
|---|---|
| Ebecryl 230 (urethane diacrylate) | 25.84 grams |
| Ebecryl 1259 (urethane triacrylate) | 6.79 grams |
| Isobornyl acrylate | 17.05 grams |
| Oleyl alcohol | 6.36 grams |
| IRR 577 (aliphatic monoacrylate) | 6.77 grams |
| Polyester-block polyether diol | 6.00 grams |
| Cumene hydroperoxide | 2.73 grams |
| Mogul L carbon black | 7.75 grams |

This formulation was passed twice through a triple roller mill and the resulting black paste was used to prepare an upper layer 101 (as in FIG. 1). The solid composition used for underlayer 102 was replaced in the mold after extracting some of the release filler forms so that there was room to adhere a 300 μm thick layer of the formulation for upper layer 101. The mold was again sealed and placed into an oven for an hour. It was then removed and water-cooled and the resulting flexographic printing plate precursor was removed.

This flexographic printing plate precursor (or blank) was placed in a conventional "engraving" or imaging apparatus fitted with IR laser diodes and imaged by ablation down to the white polyester underlayer using imaging radiation of about 910 nm and energy of about 120 J/cm$^2$. The resulting flexographic printing plate was evaluated and found to have a 300 μm relief image that was clearly visible.

EXAMPLE 2

Preferred Flexographic Printing Plate Precursor

A preferred embodiment of this invention, similar to that illustrated in FIG. 3, was prepared and imaged in the following manner. All quantities are by weight.

Mixture A:

The following ingredients were mixed and ball milled for 12 hours to give a fine dispersion of carbon black in the acrylate monomer.

| | |
|---|---|
| Mogul L carbon black | 8.71 grams |
| Isobornyl acrylate | 41.29 grams |

Mixture B:

The following mixture was made up by adding and mixing the ingredients in the order shown:

| | |
|---|---|
| Ebecryl 230 (urethane diacrylate) | 11.524 grams |
| Ebecryl 1259 (urethane triacrylate) | 1.732 grams |
| Mixture A | 17.796 grams |
| Cumene hydroperoxide | 1.344 grams |
| Polyisoprene liquid | 1.280 grams |

After thorough mixing, 6.320 grams of Cab-O-Sil M5 were added gradually to Mixture B with high speed stirring as the mixture became increasingly higher in viscosity, forming a thick paste.

A 300 μm poly(ethylene terephthalate) filler sheet was placed at the bottom of a 1.5 mm deep aluminum mold. A 175 μm white (barium sulfate-loaded) poly(ethylene terephthalate) film was cut to fit into the mold and placed on the first polyester sheet. This film corresponds to interlayer 104 shown in FIG. 3.

Pellets of KRATON D1107P (a linear block copolymer of styrene and isoprene with bound styrene of 15% mass sold by Kraton Polymers (www.kraton.com) were used to fill the mold to excess. The mold lid was screwed down tightly and the mold was placed in an oven at 160° C. for one hour.

The mold was then removed from the oven and water-cooled and the resulting combined elastomeric layer and white-pigmented layer were removed from the mold. The KRATON elastomer pellets had formed a smooth uniform thick elastomeric layer that corresponds in FIG. 3 to underlayer 102 and had become bonded to the white reflective interlayer 104.

The filler sheet was removed from the mold, and the thick Mixture B paste, as prepared above, was then placed in the bottom of the mold. The white surface of the reflective interlayer was cleaned with butyl acetate and the combined material placed reflective side down into the mold and onto the Mixture B paste. This paste provides the constituents of upper layer 101 shown in FIG. 3 that is directly bonded to white-pigmented interlayer 104, thereby omitting what is shown as adhesive layer 105 in FIG. 3.

The mold lid was screwed down so that the excess Mixture B paste flowed out, leaving a 300 μm thick layer of Mixture B. The mold was put in the oven at 160° C. for 30 minutes and then removed and water-cooled.

The resulting sandwich of layers was removed from the oven and a 175 μm transparent poly(ethylene terephthalate) film (e.g. substrate 103 of FIG. 3) was placed on the open side (non-imaging side) of the elastomeric underlayer.

The resulting flexographic printing plate precursor (or blank) was placed in a conventional engraving machine fitted with IR laser diodes and imaged by ablation down to the white polyester interlayer. The imaging radiation was at about 910 nm and the energy was about 120 J/cm$^2$. This resulting imaged flexographic printing plate was evaluated and found to have a 300 μm relief image that is clearly visible. There was a color contrast apparent between the black raised non-imaged areas of upper layer 101 and the white imaged floor on interlayer 104.

EXAMPLE 3

Another embodiment of this invention was prepared and imaged in the following manner. All quantities are by weight.

The following formulations were prepared by adding and mixing the ingredients in the order shown:

Mixture C:

| | |
|---|---|
| CN 9170 (Cray Valley) | 19.4 grams |
| Ebecryl 1259 | 5.2 grams |
| Isobornyl acrylate | 13.1 grams |
| IRR 577 | 5.2 grams |
| Polyester-block-polyether | 4.6 grams |
| Luperox 231XL40 | 2.1 grams |

Mixture C was in the form of a viscous liquid.

Mixture D:

| | |
|---|---|
| Mixture C | 35.4 grams |
| Oleyl Alcohol | 3.5 grams |
| Magnesium oxide | 6.7 grams |
| Cab-O-Sil M5 | 3.7 grams |

Mixture E:

| | |
|---|---|
| CN 9170 (Cray Valley) | 25.84 grams |
| Ebecryl 1259 | 6.79 grams |
| Isobornyl acrylate | 17.05 grams |
| Oleyl Alcohol | 6.36 grams |
| IRR 577 | 6.77 grams |
| Polyester-block-polyether | 6 grams |
| Mogul L carbon black | 7.75 grams |
| Luperox 231XL4O | 2.73 grams |
| Magnesium oxide | 13.39 grams |
| Cab-O-Sil M5 | 7.29 grams |

Mixture D was milled to form a thick white paste by twice passing it through a triple roller mill. It was then used in the manner described below to form underlayer 102 shown in FIG. 1. Excess Mixture D was placed over a release film in an aluminum mold. The mold had 175 μm shims on the flat surfaces surrounding the mold. The paste stood above the upper surface of the shims. The surface of the paste was smoothed down using a metal rod and excess material was removed to give a flat surface that was level with the top of the shims. The shims were then removed so that the mixture surface was both flat and raised above the level of the open mold. The filled open mold was then placed in a freezer at a temperature below −10° C. for 2.5 hours.

Mixture E was milled to form a thick black paste by twice passing it through a triple roller mill. It was then placed in a polyethylene terephthalate (PET) mold and smoothed to a thickness of 400 μm. The PET mold containing Mixture E was then placed on top of the frozen Mixture D so that the two mixtures were in contact with the PET mold containing Mixture E being uppermost. An aluminum lid was clamped on top of the PET mold so that the two layers were sealed. The two layers were then placed in an oven for 1 hour at 160° C. After 1 hour, the mold was removed and water-cooled to room temperature. The resulting two-layer flexographic printing precursor was removed from the mold. Mixture D had formed a white solid underlayer (like underlayer 102 of FIG. 1) that was covalently bonded to the black upper layer (like upper layer 101 of FIG. 1) that was formed from Mixture E.

This flexographic printing plate precursor was placed in a conventional "engraving" or imaging apparatus fitted with IR laser diodes and imaged by ablation down to the white underlayer using imaging radiation of about 910 nm and energy of about 120 J/cm$^2$. The resulting flexographic printing plate was found to have a black relief image with a 400 μm depth that was clearly visible against the white floor of the underlayer.

EXAMPLE 4

Mixtures C, D, and E were prepared as described above in Example 3. A release film was placed inside an aluminum mold, 1.5 mm deep, and the white Mixture D was pasted into it so that the top layer was above the surrounds of the mold. A broad metal blade was used to scrape off the excess Mixture D so that it filled the mold and had a top surface that was level with the surrounds.

A 330 spacer shim was placed on the surrounds of the mold. Black Mixture C was then spread over Mixture D and excess Mixture C was removed to flatten the top surface. A release film was placed over the open mold and the mold then closed by screwing down an aluminum lid.

The mold was then placed in the oven at 160° C. After one hour, it was then removed and cooled with water. The resulting flexographic printing plate precursor was placed in a conventional "engraving" or imaging apparatus fitted with IR laser diodes and imaged by ablation down to the white underlayer using imaging radiation of about 910 nm and an energy of about 120 J/cm$^2$. The resulting flexographic printing plate was found to have a black relief image of over 300 μm depth that was clearly visible against the white floor of the underlayer.

The invention has been described in detail with particular reference to certain preferred embodiments thereof, but it will be understood that variations and modifications can be effected within the spirit and scope of the invention.

The invention claimed is:

1. A laser imageable flexographic printing plate precursor comprising:

a thermoset, irreversibly hardened elastomeric upper layer that is at least partially ablatable, comprises a radiation sensitive compound, and an ablatable thermoset polymer derived by thermally crosslinking one or more thermally crosslinkable mono- or polyacrylates monomers or oligomers in the form of a paste, wherein said upper layer has dry thickness of from about 50 to about 600 μm, and a non-ablatable elastomeric underlayer, wherein said elastomeric upper layer and underlayer are formed by thermally crosslinking the same or different mono- or polyacrylate compounds with a peroxide.

2. The flexographic printing plate precursor of claim 1 further comprising an adhesive layer between said upper layer and said underlayer.

3. The flexographic printing plate precursor of claim 2 wherein said adhesive layer is at least partially ablatable.

4. The flexographic printing plate precursor of claim 1 further comprising a support upon which said upper and underlayers are disposed.

5. The flexographic printing plate precursor of claim 4 wherein said support is a polyester film or a metallic sheet.

6. The flexographic printing plate precursor of claim 1 wherein said upper layer is fully ablatable in imaged areas.

7. The flexographic printing plate precursor of claim 1 wherein said underlayer is reflective to imaging radiation.

8. The flexographic printing plate precursor of claim 1 wherein said upper layer has a dry thickness of from about 200 to about 400 μm.

9. The flexographic printing plate precursor of claim 1 wherein said underlayer has a dry thickness of less than 1.7 mm.

10. The flexographic printing plate precursor of claim 1 wherein said underlayer is transparent.

11. The flexographic printing plate precursor of claim 1 wherein a precast sheet of a polymeric film is disposed between said upper layer and said underlayer, wherein said precast polymeric film is non-ablatable during imaging.

12. The flexographic printing plate precursor of claim 1 having a visual color contrast between said upper layer and said underlayer.

13. The flexographic printing plate precursor of claim 1 wherein said upper layer comprises an infrared radiation absorbing compound.

14. A method of producing a flexographic printing plate comprising:

imagewise exposing a laser imageable flexographic printing plate precursor comprising:

a thermoset, irreversibly hardened elastomeric upper layer that is at least partially ablatable and comprises a radiation sensitive compound, and an ablatable thermoset polymer derived by thermally crosslinking one or more thermally crosslinkable mono- or polyacrylate monomers or oligomers in the form of a paste, wherein said upper layer has dry thickness of from about 50 to about 600 μm, and a non-ablatable elastomeric underlayer, wherein said elastomeric upper layer and underlayer are formed by thermally crosslinking the same or different mono- or polyacrylate compounds with a peroxide, to provide at least partially ablated imaged areas only in said upper layer.

15. The method of claim 14 wherein said underlayer reflects imaging radiation back into the imaged areas of said upper layer.

16. The method of claim 14 wherein said flexographic printing plate comprises a visual color contrast between imaged and non-imaged areas.

17. The method of claim 14 wherein said upper layer is fully ablated in the imaged areas.

18. The method of claim 14 wherein said laser imagewise exposure is directed to said upper layer through its top side.

19. The method of claim 14 wherein said laser imagewise exposure is directed through to said upper layer through said underlayer.

20. An imaged flexographic printing plate obtained by the method of claim 14.

21. A method of preparing a flexographic printing plate precursor comprising:

A) preparing an ablatable upper layer paste of one or more thermally crosslinkable mono- or polyacrylate oligomers or monomers, a peroxide, and a radiation sensitive compound, B) preparing a non-ablatable underlayer paste of one or more elastomeric materials that are formed from the same or different thermally crosslinkable mono- or polyacrylate oligomers or monomers with a peroxide, C) thermally crosslinking both of said upper layer and underlayer pastes simultaneously or sequentially to form an irreversibly hardened upper layer composition and a hardened underlayer solid composition, wherein said upper layer has dry thickness of from about 50 to about 600 μm, and D) adhering said upper layer and underlayer pastes to each other before or during step C, or adhering said upper layer and underlayer solid compositions to each other after step C.

22. The method of claim 21 wherein said upper layer and underlayer pastes are crosslinked and adhered to each other simultaneously.

23. The method of claim 21 wherein said upper layer and underlayer pastes are adhered to each other after each paste is crosslinked.

* * * * *